United States Patent
Angelopoulos et al.

(10) Patent No.: US 6,858,357 B2
(45) Date of Patent: Feb. 22, 2005

(54) ATTENUATED EMBEDDED PHASE SHIFT PHOTOMASK BLANKS

(75) Inventors: Marie Angelopoulos, Cortlandt Manor, NY (US); Katherina E. Babich, Chappaqua, NY (US); Cameron James Brooks, Elmsford, NY (US); S. Jay Chey, Ossining, NY (US); C. Richard Guarnieri, Somers, NY (US); Michael Straight Hibbs, Westford, VT (US); Kenneth Christopher Racette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 10/657,665

(22) Filed: Sep. 8, 2003

(65) Prior Publication Data

US 2004/0053026 A1 Mar. 18, 2004

Related U.S. Application Data

(63) Continuation of application No. 09/793,646, filed on Feb. 26, 2001, now Pat. No. 6,653,027.

(51) Int. Cl.[7] .................................................. G03F 9/00
(52) U.S. Cl. .............................................................. 430/5
(58) Field of Search .................................. 430/5, 312, 313, 430/314, 315, 316, 317, 318, 319; 427/547; 378/34, 35

(56) References Cited

U.S. PATENT DOCUMENTS

| 5,952,128 | A | * | 9/1999 | Isao et al. ........................ 430/5 |
| 5,955,223 | A | * | 9/1999 | Mitsui et al. .................... 430/5 |
| 6,335,124 | B1 | * | 1/2002 | Mitsui et al. .................... 430/5 |

* cited by examiner

Primary Examiner—Saleha R. Mohamedulla
(74) Attorney, Agent, or Firm—Daniel P. Morris

(57) ABSTRACT

An attenuating embedded phase shift photomask blank that produces a phase shift of the transmitted light is formed with an optically translucent film made of metal, silicon, nitrogen or metal, silicon, nitrogen and oxygen. A wide range of optical transmission (0.001% up to 20% at 193 nm) is obtained by this process. A post deposition process is implemented to obtain the desired properties (stability of optical properties with respect to laser irradiation and acid treatment) for use in industry. A special fabrication process for the sputter target is implemented to lower the defects of the film.

47 Claims, 9 Drawing Sheets

| Embodiment ID | Ar Pressure (mT) | Ar flow (sccm) | N₂ flow (sccm) | Thickness (Å) | Si(at.%) | Ti(AT.%) | N(at.%) | O(at.%) |
|---|---|---|---|---|---|---|---|---|
| 1 | 1 | 15 | 6 | 913 | 40.6 | 3.8 | 55.3 | 0.3 |
| 2 | 1 | 15 | 7.5 | 812 | 39.7 | 3.5 | 56.4 | 0.5 |
| 3 | 1 | 15 | 9 | 739 | 39.2 | 3.3 | 57.1 | 0.36 |
| 4 | 2 | 15 | 6 | 838 | 39.1 | 3.6 | 56.3 | 0.96 |
| 5 | 2 | 15 | 9 | 667 | 38.5 | 3.3 | 56.2 | 1.97 |
| 6 | 5 | 15 | 6 | 761 | 36.5 | 3.5 | 47.3 | 12.74 |
| 7 | 5 | 15 | 7.5 | 635 | 36.7 | 3.5 | 42.3 | 17.5 |
| 8 | 5 | 15 | 9 | 580 | 37.1 | 3.4 | 46.2 | 13.35 |

Estimated Relative Composition in Atom Percent, from ESCA Surface Survey Scans

| Sample Description | C | N | O | Si | Ti |
|---|---|---|---|---|---|
| Surface compositions | | | | | |
| Embodiment 9: 690Å thick film, as-deposited (1 mT, $N_2$ flow 9 sccm) | 7.4 | 36.3 | 21.6 | 32.0 | 2.2 |
| Embodiment 9-annealed: 690Å thick film, annealed in air, 225°C, 15 minutes | 5.5 | 34.9 | 24.3 | 32.0 | 2.3 |
| Embodiment 10: 890Å thick film, as-deposited (5 mT, $N_2$ flow 9 sccm) | 12.2 | 28.1 | 29.8 | 27.7 | 2.0 |
| Embodiment 10-annealed: 890Å thick film, annealed in air, 225°C, 15 minutes | 12.6 | 26.4 | 31.8 | 26.9 | 2.1 |
| Bulk compositions | | | | | |
| Embodiment 9: 690Å thick film, as-deposited (1 mT, $N_2$ flow 9 sccm) | <1 | 54.1 | <1 | 41.6 | 3.3 |
| Embodiment 9-annealed: 690Å thick film, annealed in air, 225°C, 15 minutes | <1 | 52.4 | <1 | 41.9 | 4.4 |
| Embodiment 10: 890Å thick film, as-deposited (5 mT, $N_2$ flow 9 sccm) | <1 | 40.3 | 16.3 | 39.1 | 4.3 |
| Embodiment 10-annealed: 890Å thick film, annealed in air, 225°C, 15 minutes | <1 | 38.3 | 17.4 | 40.2 | 4.0 |

Fig. 5A

| | Air anneal 225°C, 15 min | N$_2$ anneal 225°C, 15 min | Oxygen plasma (200W, 60min) |
|---|---|---|---|
| %T (initial) | 5.61 | 5.61 | 5.60 |
| %T (after treatment) | 6.11 | 5.92 | 6.12 |
| %T change after laser irradiation | 0.27% after 5.4 kJ/cm$^2$ | 0.32% after 2.2 kJ/cm$^2$ | |

| ID | $P_{Ar}$ (mT) | $P_{N2}$ (mT) | $P_{O2}$ (mT) | Si(%) | Ti(%) | N(%) | O(%) | $t_{193nmPS}$ (Å) | %T 193nmPS | n | k |
|---|---|---|---|---|---|---|---|---|---|---|---|
| 11 | 1 | 0.3 | 0.1 | 36 | 3.4 | 30 | 30 | 910 | 21.4 | 2.07 | 0.24 |
| 12 | 1 | 0.3 | 0.11 | 33.5 | 3 | 19.2 | 43.7 | 1,242 | 23 | 1.78 | 0.17 |
| 13 | 1 | 0.3 | 0.15 | 29.1 | 3.2 | 1.4 | 65.9 | 1,668 | 29 | 1.58 | 0.11 |
| 14 | 1 | 0.3 | 0.15 | 28.8 | 3.8 | 1.8 | 65.9 | 1,563 | 20.6 | 1.62 | 0.15 |

| Embodiment ID | Ti Power (W) | Ar Pressure (mT) | Thickness (Å) | Deposition Time (sec) | Si(at.%) | Ti(at.%) | N(at.%) | O(at.%) |
|---|---|---|---|---|---|---|---|---|
| 15 | 80 | 2 | 726 | 400 | 40.8 | 2.5 | 53 | 3.27 |
| 16 | 90 | 2 | 729 | 400 | 39.2 | 2.9 | 53.5 | 4.19 |
| 17 | 120 | 2 | 673 | 400 | 38.6 | 4 | 52.5 | 4.58 |
| 18 | 80 | 1 | 1,169 | 600 | 40.5 | 2.6 | 55 | 1.39 |
| 19 | 120 | 1 | 1,212 | 600 | 38.9 | 4.2 | 54.9 | 1.6 |

ATTENUATED EMBEDDED PHASE SHIFT PHOTOMASK BLANKS

This is a continuation of application Ser. No. 09/793,646 filed on Feb. 26, 2001 now U.S. Pat. No. 6,653,027.

FIELD OF THE INVENTION

The present invention is directed to attenuated embedded phase shift photomask blanks and in particular to attenuated phase shift mask (APSM) materials and processes.

BACKGROUND OF INVENTION

Phase shift masks are gaining attention as the next generation lithographic technique for microelectronic fabrication due to their capability to produce higher resolution images compared to the conventional binary photomasks. Among the several phase shifting schemes, the attenuating embedded phase shifter proposed by Burn J. Lin, Solid State Technology, January issue, page 43 (1992), the teaching of which is incorporated herein by reference, is gaining wider acceptance because of its ease of fabrication and the associated cost savings. There have been a number of variations associated with this scheme to improve the optical properties of the photomask, i.e. tunability of the optical transmission and resistance against photon irradiation and chemical treatments.

The attenuated phase shift mask (APSM) described in U.S. Pat. No. 5,897,977 to Carcia et al. consists of alternating layers of optically transmissive materials and optically absorbing materials. The advantage claimed by this process is that the phase shift and transmission can be controlled easily by adjusting the thickness of either or both of the layers. However, the deposition process is complicated since two different materials need to be deposited in an alternating sequence, which will increase the cost of the process and increase potential defects in the mask. Also, due to the different etching properties of the two materials, obtaining a smooth line edge by etching is difficult.

The APSM described in U.S. Pat. No. 5,939,227 to Smith consists of a multilayer of $Si_xN_y$ and metal nitride. The advantage claimed by this process is both materials are chemically stable and etch selectivity is well defined. However, the deposition of this process is complicated since it requires two separate targets and a planetary sample stage, which increases the cost for manufacturing and again significantly increases potential defect levels.

A Zr-based APSM described in U.S. Pat. No. 5,935,735 to Okubo et al., wherein the film had 2 to 15% transmittance and less than 30% reflectivity. The Zr-based film consisted of two or more multilayers with different optical properties to achieve the above transmittance and reflectivity. While this scheme provides good tunability, a multilayer structure may not provide good manufacturability. Also, due to the highly stable nature of Zr compounds, the RIE etch selectivity is inferior.

The APSM described in U.S. Pat. Nos. 5,942,356 and 6,153,341 to Mitsui et al., consists of molybdenum, silicon and nitride. The advantage claimed of this process is that it consists of a single material which gives good etch properties. Also, the material is stable during laser irradiation and acid treatment. However, the tunability of % T is not as flexible as the multilayer materials. Mitsui et al., does not incorporate a post-deposition treatment in their patent.

Herein we describe a method to fabricate, through deposition and post deposition treatment, a phase shift photomask that has tunable optical transmission, coupled with stable optical properties during usage (photon exposure and chemical treatments) of the photomask.

The present invention provides a phase shift photomask with a small surface roughness and low defect density by reducing the particulates produced during the deposition process.

We have also discovered that when the phase shift mask or phase shift mask blank is annealed to a temperature higher than room temperature under an atmosphere which contains oxygen at more than $10^{-3}$ torr partial pressure, a film structure can be produced that is stable against photon irradiation and chemical treatments for photomask fabrication.

SUMMARY OF THE INVENTION

A broad aspect of the present invention comprises an attenuating embedded phase shift photomask blank capable of producing a phase shift of 180° with an optical transmission of at least 0.001% at a selected lithographic wavelength, having chemical and optical durability and flexible optical transmission tunability.

In another aspect, the invention comprises a process of making an attenuating embedded phase shift photomask, which process comprises the steps of depositing a thin film phase shifting material.

In another aspect, the invention comprises a process of making an attenuating embedded phase shift photomask, which uses a composite target with high material density and high discharge stability during the deposition process.

In another aspect, the invention comprises a process for stabilization and improvement of the optical characteristics of the phase shifting material.

BRIEF DESCRIPTION OF THE DRAWINGS

These and other objects, features and advantages of the present invention will become apparent upon a consideration of the following detailed description and the invention when read in conjunction with the drawing Figures, in which.

DETAILED DESCRIPTION

Figures 1, 2:
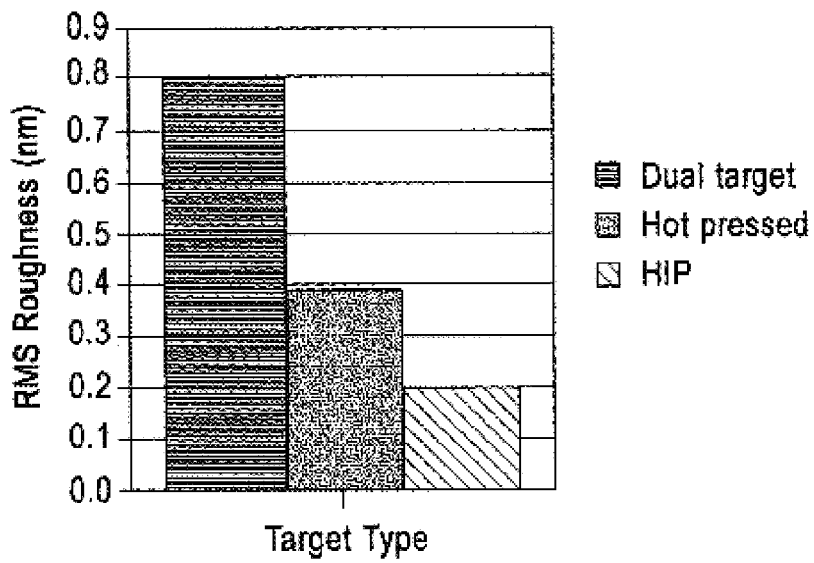
FIG. 1 is a bar graph showing the Root mean square (RMS) roughness of the deposition using three different targets. The RMS roughness is measured over a 2000 Å×2000Å scan area of an Atomic Force Microscope (DI5000, tapping mode). The RMS roughness is 0.80, 0.39 and 0.20 nm for films deposited with Dual target, Hot pressed target, and HIP target, correspondingly.
FIG. 2 is a summary of the RBS analysis of various films deposited under single target configuration.

A process is discovered for fabricating photomask blanks that produces phase shifting films having tunable optical characteristics (% T,n and k) (T is the transmission; n is the index of refraction; and k is the extinction coefficient) with 180° phase shift at 193 nm and with significantly enhanced exceptional stability against laser irradiation and chemical treatment. The phase shifting films comprise of silicon and a metal and nitrogen and/or oxygen. The metal can be an element from the groups II, IV, V, transition metals, lanthanides and actinides. An example will be given for titanium as the metal. The invention comprises a thin phase shifting film ($Si_wTi_xN_y$ or $Si_wTi_xN_yO_z$, where w is in the range 0.1 to 0.6, x is in the range 0.01 to 0.2, y is in the range 0 to 0.6, z is in the range 0 to 0.7.) deposited on a substrate (quartz, $Al_2O_3$, etc) with a thin oxygen rich layer on the surface and the methods for forming the films and enhancing their characteristics.

1. Deposition

The initial thin film can be deposited by sputter deposition (RF, DC magnetron, AC magnetron, pulsed bipolar DC magnetron, RF diode sputtering, or other sputter deposition methods familiar to those skilled in the art) from either a single target of a composite material ($Si_{1-x}Ti_x$, with x in the range 0.01 to 0.5) or two or more targets of different compositions (for example, $Si_3N_4$ and Ti targets, or $Si_{1-x}Ti_x$ and Ti targets). Variation in composition of the composite targets or individual variation of power and deposition time of the pure targets produces changes in film composition. Reactive sputtering with nitrogen and oxygen provides further capability to adjust the relative compositions of Si, Ti, and N and O, and thus the optical characteristics of the film. The substrate stage can be either stationary or planetary for the single target, and planetary for the multitarget with rotation speed adjusted accordingly.

Specifically, a RF magnetron sputtering was used for a single target ($Si_{0.7}(TiSi_2)_{0.1}$) deposition and a RF and DC magnetron co-deposition was used for dual target ($Si_3N_4$ and Ti) deposition.

2. Post-Deposition Modification of Film Structure

The surface layer of the deposited film becomes oxygen rich when exposed to air but is still unstable against radiation and chemical treatment. Subsequent heat treatment (air annealing) produces a much enhanced stability. X-Ray Photoelectron Spectroscopy (XPS) results show about 2% increase in the oxygen concentration of the surface after annealing at 225° C. in air atmosphere. This surface enhancement can be accomplished by either air annealing at elevated temperature or other gas mixtures or plasma treatment in an oxidizing environment.

The enhanced stability can be attributed to the fact that the change of optical properties during irradiation is due to the photon induced oxidation under oxidizing atmosphere. Thus, by pre-oxidizing the surface with the described methods, the optical properties of the deposited film show an enhanced stability against irradiation. Details of the post-deposition modification is described in section 5 (A).

3. Optical Properties

The optical properties (index of refraction (n), and extinction coefficient (k)) were determined using an n&k spectrophotometer in the range of 190 to 900 nm. The transmission at 180° phase shift was calculated by using these n and k values.

4. Fabrication Process of the $Si_{0.7}(TiSi_2)_{0.1}$ Target

A special target for the composite cathode is utilized. Instead of mixing Ti and Si elements, a mixture of $TiSi_2$ and Si was used. It was reported, U.S. Pat. No. 5,686,206, paragraph 6, line 56–67, that the discharge during sputter deposition becomes unstable as the silicon to metal ratio increases. In particular, for Mo and Si, the discharge became unstable for targets with Si larger than 95 mol percent. The problem is due to low conductivity at the target surface since $SiN_x$, which is an insulator, is formed during the process.

By utilizing the described process, we were able to increase the metal to silicon ratio increased from 1/9 to 1/7 (i.e., 28% increase of the metal to silicon ratio), thereby decreasing the amount of $SiN_x$ layer. The target consists of 10 atomic percent of Ti in the form of $Si_{0.7}(TiSi_2)_{0.1}$ instead of $Ti_{0.1}Si_{0.9}$.

Also, to reduce the particulate formation during the deposition, the target can be made using a HIP (hot isostatic pressing) process. The HIP process typically yields an increase in the density of the target as compared to the conventional hot pressing process. The improved densification varies with material properties but generally leads to, a reduction of particulate levels in the sputter deposited films which reduces the defects and surface roughness, as well as improving the target machinablility and strength. Hot pressed targets of this material exhibited a density of 2.085 which is 75% of the theoretical density of 2.78. HIP targets of this material possess densities of 96–98% of theoretical values without interconnecting voids, resulting in significant improvements to the strength and particulate levels of the target.

To demonstrate the improvement of the surface roughness, the Atomic Force Mircroscope data is shown in FIG. 1. The RMS roughness was taken over 2000 Å×2000Å area for three different deposition conditions. The first was the dual target deposition (Hot pressed target ($Si_{0.7}(TiSi_2)_{0.1}$) in RF with Hot pressed Ti target in DC), the second was the conventional Hot pressed target ($Si_{0.7}(TiSi_2)_{0.1}$), the third was a HIP processed target ($Si_{0.7}(TiSi_2)_{0.1}$). The thickness of the film was 670Å for all three samples. The dual target deposition was the roughest (0.8 nm), then the Hot pressed target (0.39 nm), and the HIP processed target gave smoothest surface RMS roughness (0.20 nm) with 15% uncertainty of the measurement.

5 EXAMPLES (A). $Si_wTi_xN_y$ or $Si_wTi_xN_yO_z$ Photomask Blanks Prepared by Single Target 1) Processing Gas $Ar/N_2$ Thin films composed of $Si_wTi_xN_y$ or $Si_wTi_xN_yO_z$ by using a $Si_{0.7}(TiSi_2)_{0.1}$ target were deposited, with the substrate in a rotating holder with planetary motion or positioned under the target without planetary motion. Sputtering was carried out in an argon/nitrogen mixture with 1.0–5.0 mT Ar partial pressure. Ultra high purity gases were used for both Ar and $N_2$ (99.999%) and the background pressure of the chamber was <9.0×10$^{-7}$ torr. The thin film was deposited by RF magnetron sputtering from a five inch diameter target with a power of 450 W. Under the above conditions, the deposition rate was typically 0.6 to 1.6 Å/sec.

Prior to sputtering, the target was presputtered in 5 mT Ar for 5 min at 450 W. Then 5 min of presputtering was performed under the deposition condition of the thin film to precondition the surface of the target. After presputtering, the substrates were immediately loaded through a load lock chamber into the deposition chamber and deposition was carried out. The film thickness ranged between 400 to 2000 Å depending on the deposition conditions. FIG. 2 summarizes the film deposition conditions and the resulting composition obtained from RBS analysis.

Figure 3A:
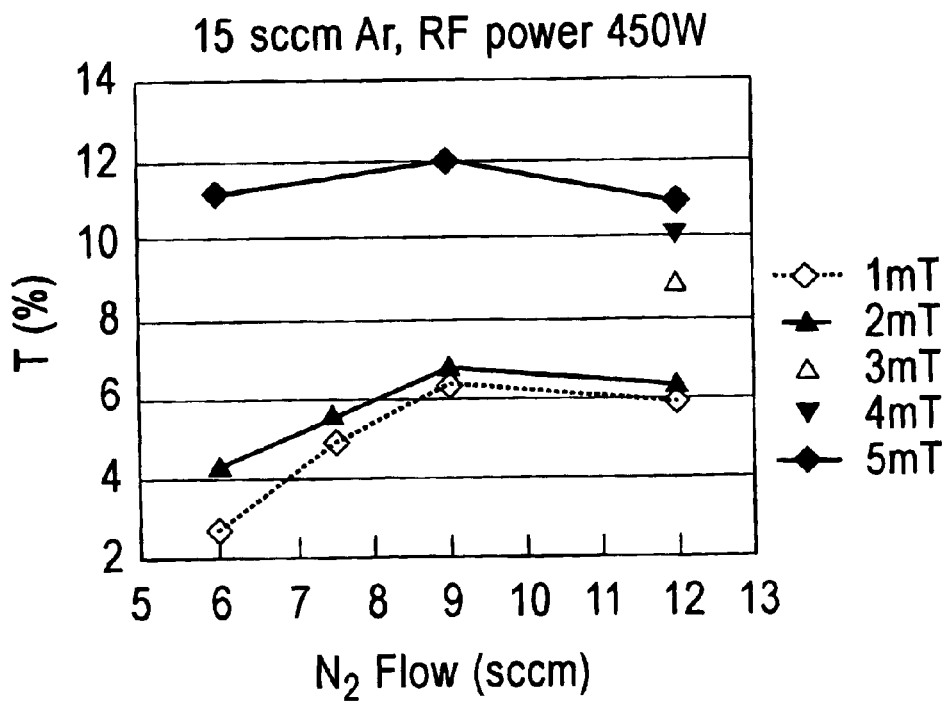
FIG. 3A is a graph showing the relationship between the transmission (% T) at 193 nm wavelength and the $N_2$ flow (sccm) for the composite cathode($Si_{0.7}(TiSi_2)_{0.1}$). All were deposited at 15 sccm Ar flow.
Figure 3B:
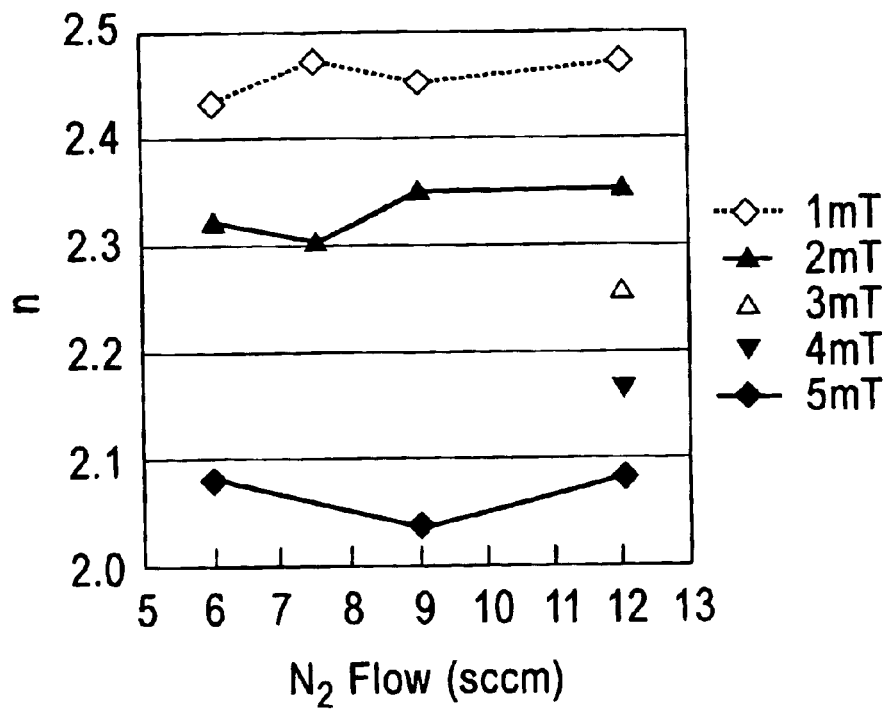
FIG. 3B is a graph showing the relationship between refractive index (n) at 193 nm wavelength and the $N_2$ flow (sccm) for the same samples in FIG. 3A.
Figure 3C:
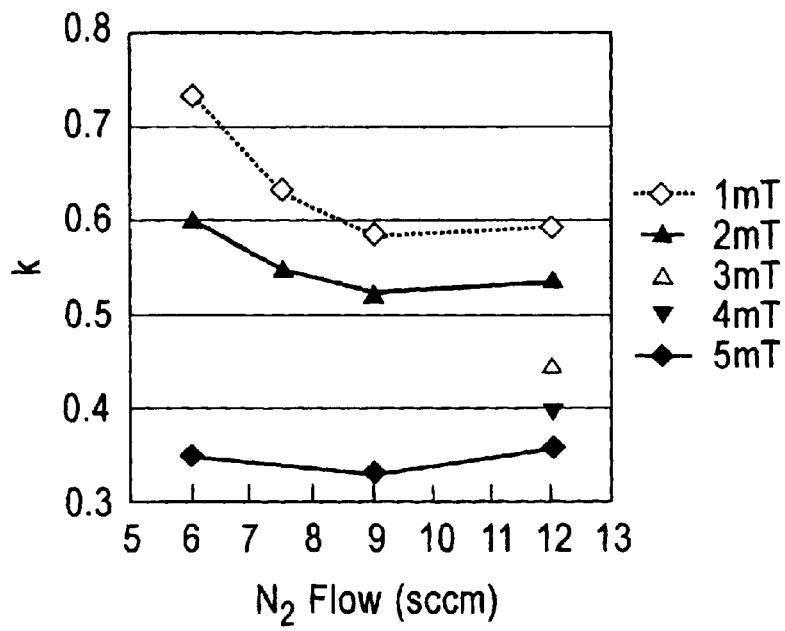
FIG. 3C is a graph showing the relationship between extinction coefficient (k) at 193 nm wavelength and the $N_2$ flow (sccm) for the same samples in FIG. 3A.

FIG. 3A. summarizes the % T calculated for films at 180° phase shift versus the $N_2$ flow. The % T increases with increasing $N_2$ flow from 6–9 sccm, beyond which little change is observed with higher $N_2$ flow. The RBS result shows that the amount of $N_2$ incorporated into the film increases with $N_2$ flow until about 9 sccm, then changes little with further increase of $N_2$ flow. FIGS. 3B and 3C summarize the n and k values as a function of $N_2$ flow and deposition pressure, respectively. The RBS analysis shows an increasing oxygen concentration in the film as the deposition pressure increases. The optical properties, n and k are dependent on the N and O concentration of the film and the density of the film. Higher deposition pressure reduces the film density and reduces the n value.

The reason for increasing O incorporation as the deposition pressure increases is thought to be the following. The increasing pressure reduces the kinetic energy of the ions and radicals in the plasma (shorter mean free path), and thus makes background oxygen easier to stick to the surface as materials are being deposited.

Figure 4:
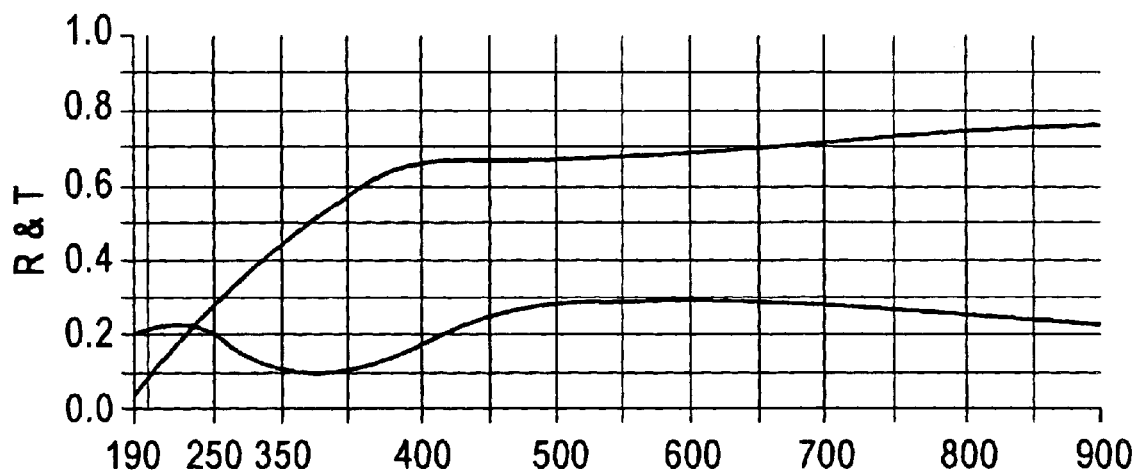
FIG. 4 is a plot of the Transmission and Reflectivity as a function of wavelength from 190 to 900 nm.

FIG. 4 is an example of the transmission and reflectivity curves measured from the n&k analyzer. The sample was deposited at 1 mT, Ar flow 15 sccm, $N_2$ flow 9 sccm, thickness 679 Å, followed by an air anneal at 225° C. for 15 min. For this thickness, the phase shift calculated from the n and k value at 193 nm is 183.1 degrees. The transmission at 193 nm was measured as 5.72%. The film composition measured by RBS is Si 39 atomic %, Ti 3.3 atomic %, N 57 atomic %, O<1 atomic %.

Figure 5B:
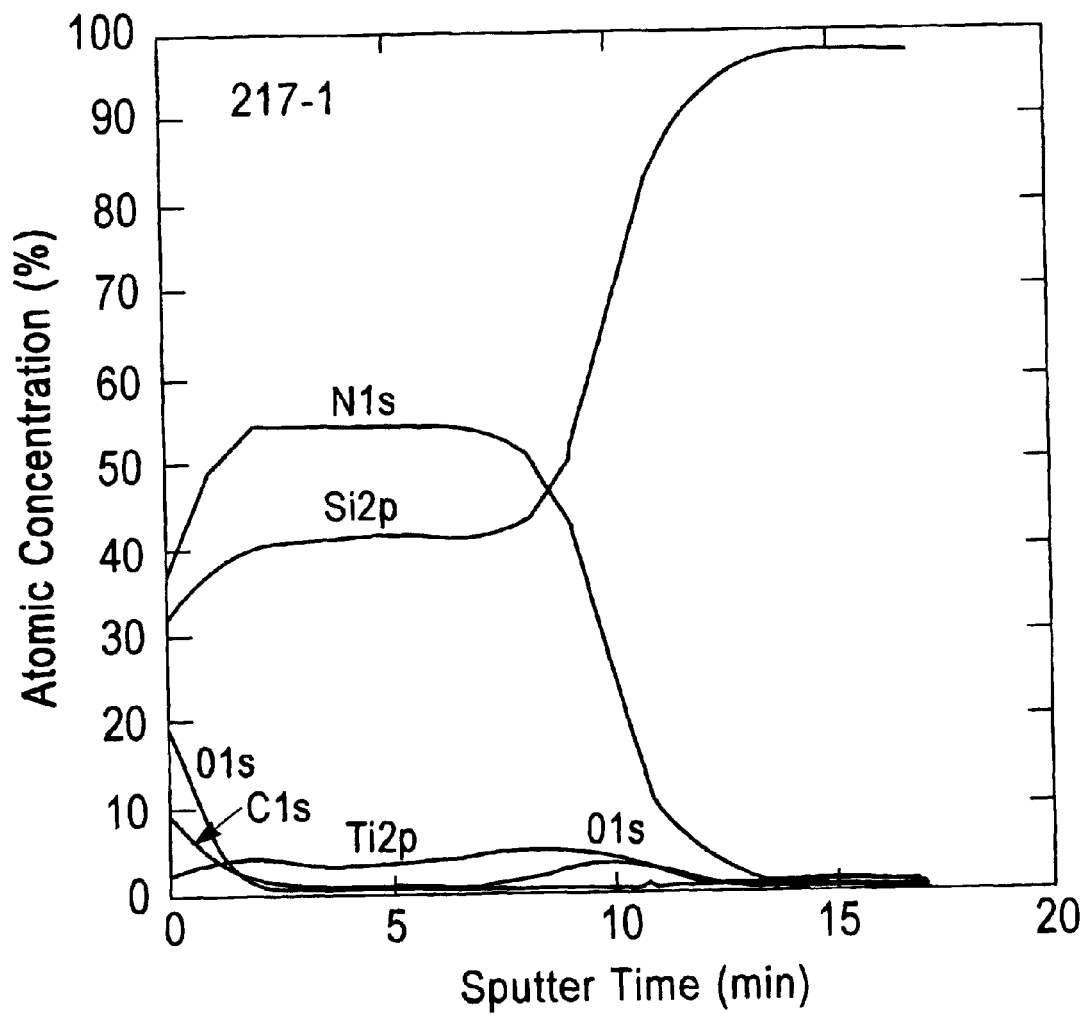
FIG. 5 XPS analysis of the deposited thin films. (a) surface and bulk compositions of the thin films before and after annealing. (b) A depth profile plot of embodiment 9. The sputter time is proportional to the film thickness, zero minute indicates the surface.

FIG. 5(a) is an XPS analysis of the surface and bulk concentration of two embodiments before and after post-deposition process. Deposition condition for embodiment 9 is 1 mT, $N_2$ flow—9 sccm, and RF power—450 W, film thickness 679 Å. Deposition condition for embodiment 10 was 5 mT, $N_2$ flow—9 sccm, and RF power—450 W, film thickness 890 Å. In this example, the process involves 225° C. annealing in air atmosphere for 15 minutes. The oxygen concentration of the surface increases about 2% after the annealing for both embodiments. While the oxygen concentration increase of the bulk film was not detected, it is possible a small amount (below the XPS detection limit, <1%) bulk oxygen increase could have occurred and affect the optical property. FIG. 5(b) is a depth profile of the chemical concentration of embodiment 9. The sputter time increase corresponds to the film thickness increase.

Figures 6, 7:
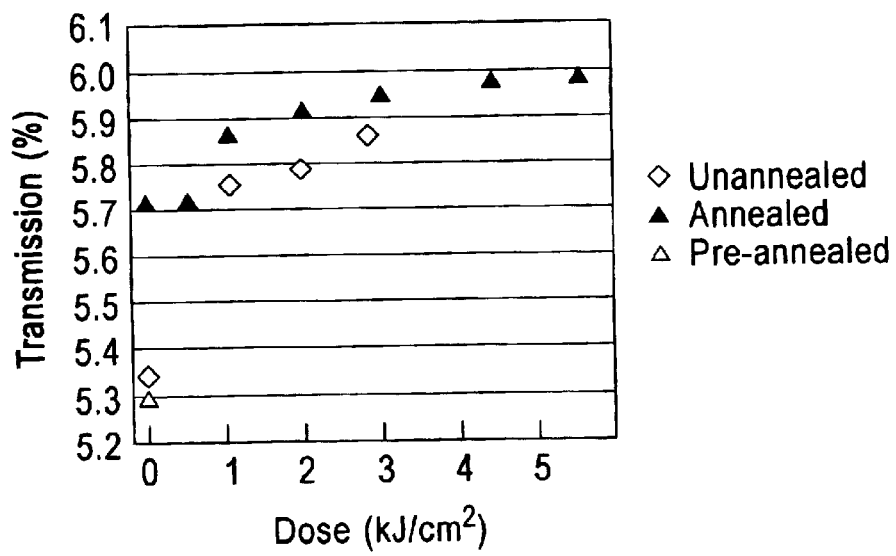
FIG. 6 is a graph showing the relationship between the transmission (% T) at 193 nm wavelength and the laser dosage (kJ/cm$^2$). Two samples, annealed and unannealed, are plotted together for comparison. The annealed sample shows an improved stability compared to the unannealed sample. The laser power density was 1.75 mJ/cm$^2$/pulse at 100 Hz frequency.
FIG. 7 is a summary of the % T changes after executing three different post-deposition processes (air anneal, $N_2$ anneal, and oxygen plasma treatment) and % T changes after laser irradiation.

FIG. 6 summarizes the change of % T at 193 nm as a function of Ar-F laser at 193 nm (Lambda Physik LPX 120) irradiation with and without the post-deposition process. The samples were prepared at deposition pressure 1 mT of Ar with $N_2$ at 9 sccm, RF power of 450 W. The film thickness corresponded to 679 Å. In order to perform irradiation studies, two films under the identical conditions were deposited on the substrate. The second film was annealed in air atmosphere at 225° C. for 15 minutes. These films were both irradiated with laser power density of 1.75 mJ/cm$^2$/pulse at 100 Hz frequency. The unannealed film shows significant radiation instability (>0.5% increase in transmission) especially during the first kJ of irradiation. The huge Transmission increase after the first kJ is no longer present in the annealed sample. The total transmission change at a dose of 5.4 kJ/cm$^2$ is 0.27%. Note that there is transmission change caused by annealing (0.42%).

Other examples of post-deposition process include oxygen plasma treatment and annealing under nitrogen atmosphere. The comparison of the two with air anneal is shown in FIG. 7. The increase of the % T after oxygen plasma treatment is comparable to the air annealing at 225° C. for 15 minute. The % T increase is smaller for the $N_2$ annealing at 225° C. for 15 min. compared to the other two processes. Also, the $N_2$ annealing improves the stability of the film to some degree due to the finite amount of oxygen background pressure. However, the stability is inferior to the air annealed result. For example, in FIG. 7, the % T of the air annealed sample increased 0.27% over laser dosage of 5.4 kJ/cm$^2$, while the % T of the $N_2$ annealed sample increased 0.32% over dosage of 2.2 kJ/cm$^2$, already exceeding the % T for the air annealed sample at less than half of the laser dose.

Figures 8, 9:
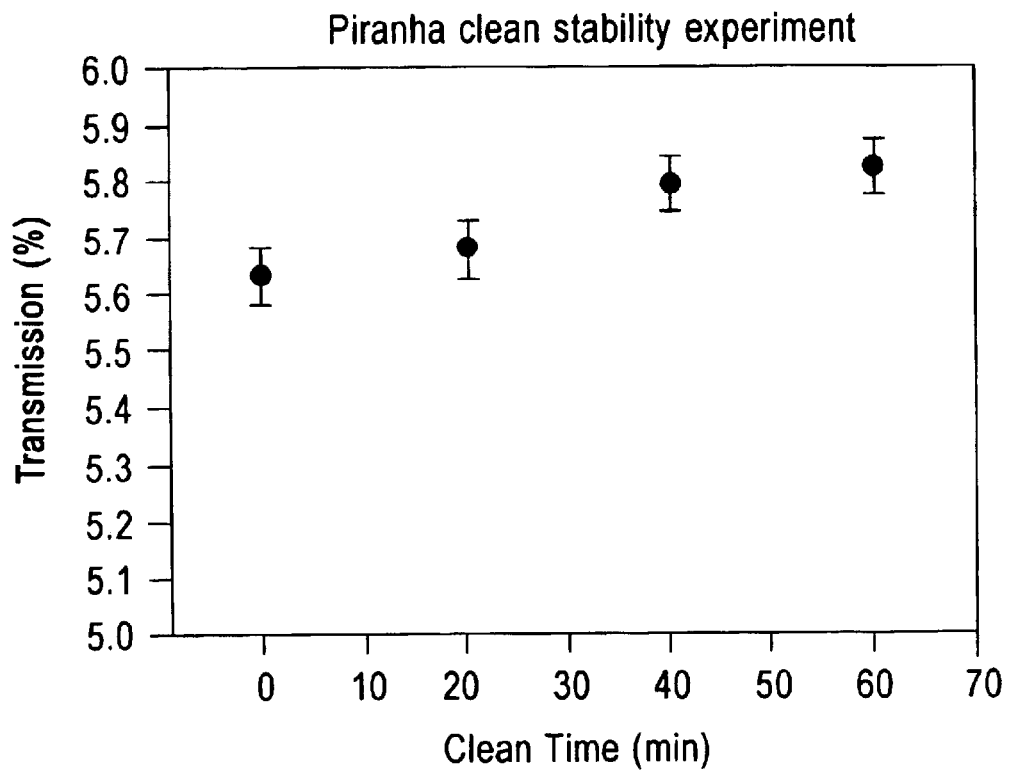
FIG. 8 is a graph showing the relationship between the transmission (% T) at 193 nm wavelength and the duration time of film exposed to a mixture of $H_2SO_4:H_2O_2$=10:1 at 95° C. (also known as piranha solution). The % T change was 0.19% over 60 min immersion in the solution.
FIG. 9 is a summary of the RBS analysis and optical properties of films deposited with various oxygen partial pressures.

FIG. 8 summarizes the change of % T at 193 nm as a function of immersion time in a cleaning solution of sulfuric acid and hydrogen peroxide($H_2SO_4$:$H_2O_2$=10:1, 95° C.), this solution is typically used for stripping photoresists in manufacturing line, also known as piranha solution. The deposition and post-deposition process is identical to the film described in FIG. 6. The total change of % T is 0.19% over 60 min of immersion. This excellent stability ensures a compatibility of the material with the standard photomask manufacturing process.

2) Processing Gas $Ar/N_2/O_2$

Thin films composed of $Si_wTi_xN_yO_z$ by using a $Si_{0.7}(TiSi_2)_{0.1}$ target were deposited, with the substrate in a rotating holder with planetary motion or positioned under the target without planetary motion. Sputtering was carried out in an argon/nitrogen/oxygen mixture processing gas with 1.0 mT Ar partial pressure (Ar flow at 15 sccm) and 0.30 mT $N_2$ partial pressure ($N_2$ flow at 5.55 sccm). Oxygen was leaked in with a Gransville-Phillips precision leak valve to maintain a constant $O_2$ partial pressure ranging from 0.10 to 0.20 mT. The thin film was deposited by RF magnetron sputtering from a five inch diameter target with a power of 450 W. Under the above conditions, the deposition rate was typically 0.75 to 1.6 Å/sec.

Prior to sputtering, the target was presputtered in 5 mT Ar for 5 min at 450 W. Then 5 min of presputtering was performed under the deposition condition of the thin film to precondition the surface of the target. After presputtering, the substrates were immediately loaded through a load lock chamber into the deposition chamber and deposition was carried out. The film thickness ranged between 400 to 2000 Å depending on the deposition conditions.

By adjusting the oxygen to nitrogen, transmission as high as 20% can be achieved at 193 nm for film thickness corresponding to 180 degree phase shift. Such wide transmission window provides the possibility of extending the operation wavelength down to 157 nm. FIG. 9 summarizes the film deposition conditions, optical properties (% T at 180 degree phase shift, n, and k), and the resulting composition obtained from RBS analysis.

B. $Si_wTi_xN_y$ where as w=0.1~0.6, x=0.01~0.2, y=0.3~0.6 and $Si_wTi_xN_yO_z$, where as w=0.1~0.6, x=0.01~0.2, y=0~0.6, and z=0~0.7 photomask blanks prepared by multitarget.

Thin films composed of $Si_wTi_xN_y$ and $Si_wTi_xN_yO_z$ by using $Si_3N_4$ and Ti targets were deposited, with the substrate in a rotating holder with planetary motion. Sputtering was carried out in an argon/nitrogen gas mixture at 1–2 mT deposition pressure with Ar flow at 15 sccm and $N_2$ flow at 6 sccm. The $Si_3N_4$ target was sputtered with an RF magnetron at a fixed power of 900 W and the Ti target was sputtered with a dc magnetron using power ranging from 0 to 200 W. Both targets were 5 inch in diameter. Under the above conditions, the deposition rate was typically 1.7 to 2.1 Å/sec.

Prior to sputtering, both targets were simultaneously presputtered in 5 mT Ar for 5 min at 900 W and 400 W for the RF and DC cathodes respectively. Then 5 min of presputtering was performed under the deposition conditions of the thin film to precondition the surface of the targets. After the presputtering, immediately the substrates were loaded through a load lock chamber into the deposition chamber and deposition was carried out. The film thickness ranged from 400 to 2000 Å depending on the deposition parameters.

Figures 10, 11A:
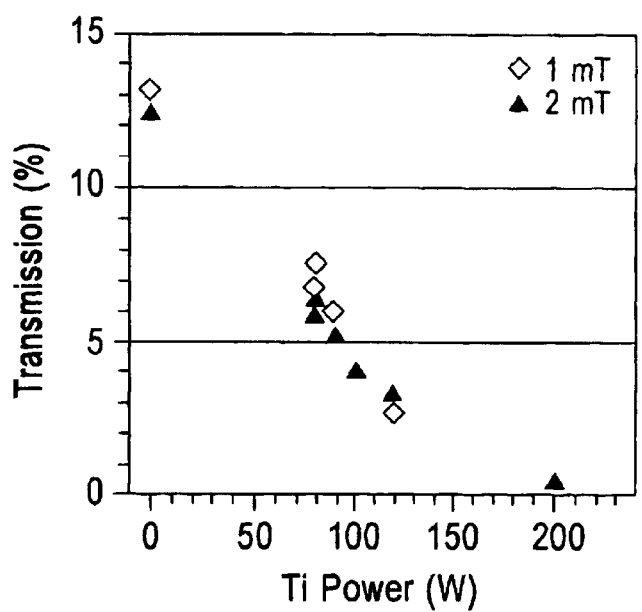
FIG. 10 is a summary of the RBS analysis for various samples deposited under dual target configuration.
FIG. 11A is a graph showing the relationship between the transmission (% T) at 193 nm wavelength and the power (watt) applied to the Ti cathode for the deposition of $Si_wTi_xN_y$ and $Si_wTi_xN_yO_z$ using co-sputtering from two pure targets: silicon nitride ($Si_3N_4$) and titanium (Ti).
Figure 11B:
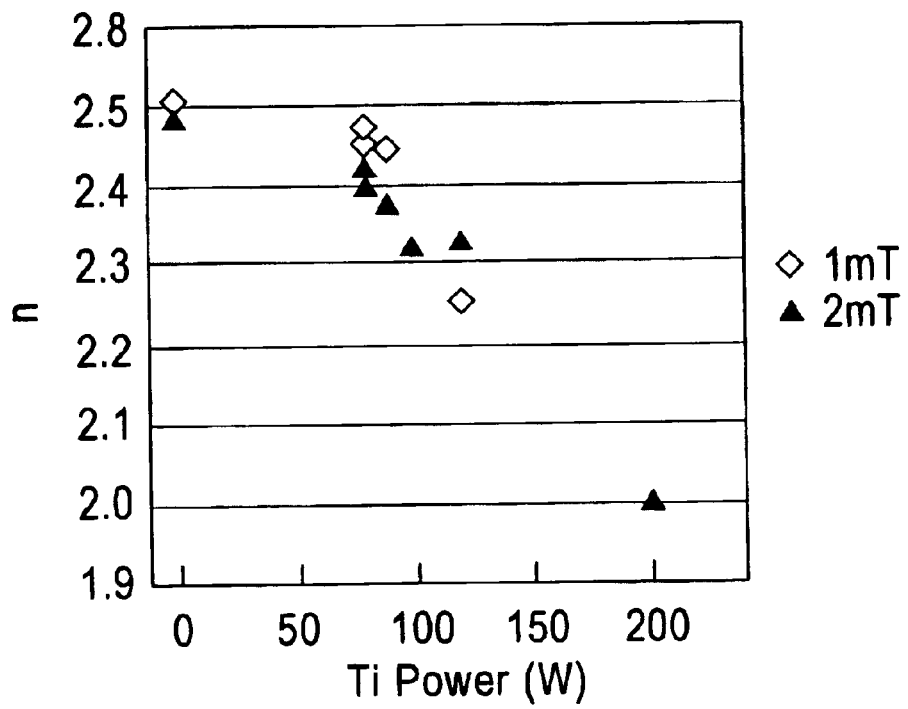
FIG. 11B is a graph showing the relationship between the refractive index (n) at 193 nm wavelength and the power (watt) applied to the Ti cathode for the same samples in FIG. 11A.
Figure 11C:
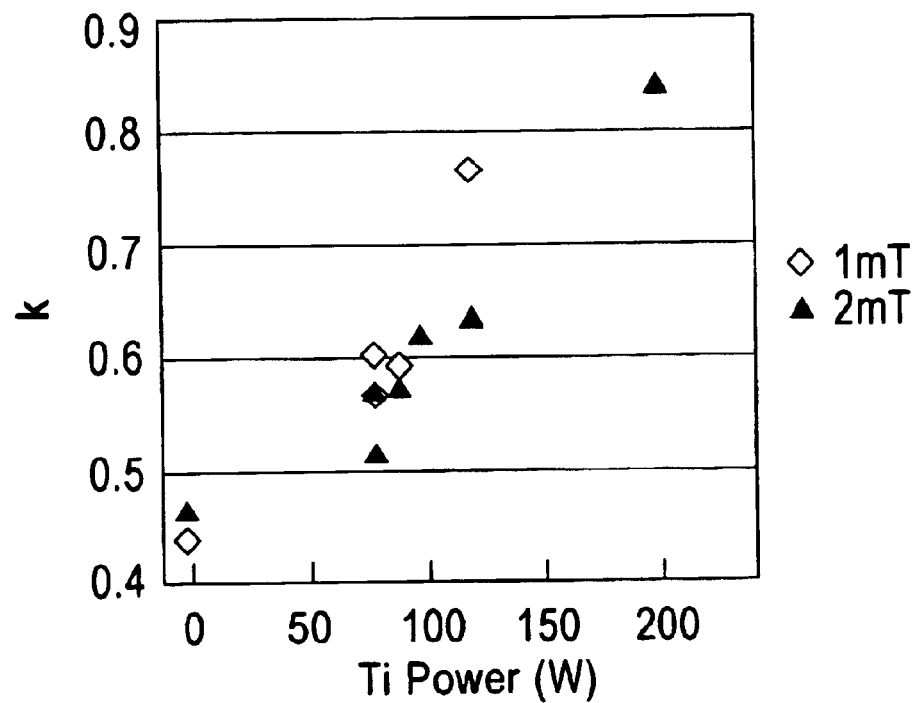
FIG. 11C is a graph showing the relationship between the extinction coefficient (k) at 193 nm wavelength and the power (watt) applied to the Ti cathode for the same samples in FIG. 11A.

FIG. 10 summarizes the film deposition conditions and the resulting composition obtained from RBS analysis. FIG. 11A summarizes the % T calculated for films at 180° phase shift versus the Ti target power. The % T decreases as the Ti target power increases. The increase of Ti power incorporates more Ti into the film (see FIG. 10) which reduces the % T. The % T is tunable by varying the Ti concentration. FIG. 11B and FIG. 11C summarize the n and k values as a function of Ti target power respectively.

While this invention has been described in terms of certain embodiment thereof, it is not intended that it be limited to the above description, but rather only to the extent set forth in the following claims. The embodiments of the invention in which an exclusive property or privilege is claimed are defined in the appended claims. The teaching of all references cited herein, are incorporated herein by reference.

What is claimed is:

1. An attenuating phase shift mask blank for use in lithography comprising:

substrate;

a phase shifting layer disposed on said substrate;

said phase shifting layer comprising a top surface layer rich an oxygen;

said top surface layer comprises a higher concentration of oxygen than that part of said phase shifting layer not including said surface layer;

said phase shift mask blank is capable of producing a photomask with substantially 180° phase shift and an optical transmission of at least 0.001% at a selected wavelength of <500 nm.

2. An attenuated phase shift mask blank according to claim 1 wherein the phase shifting layer comprises a composite material of formula $A_wB_xN_yO_z$, where A is an element selected from the group consisting of Groups IVA, VA, or VIA; and B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7.

3. An attenuated phase shift mask blank according to claim 1 wherein the phase shifting layer comprises a material selected from the group consisting of a silicon/titanium/nitrogen composite and a silicon/titanium/nitrogen/oxygen composite.

4. An attenuated phase shift mask blank according to claim 3 wherein said silicon/titanium/nitrogen composite has structural formula $Si_wTi_xN_y$ wherein w=0.1~0.6, x=0.01~0.2, y=0.3~0.6.

5. An attenuating phase shift mask blank according to claim 3 wherein said silicon/titanium/nitrogen/oxygen composite has structural formula $Si_wTi_xN_yO_z$ wherein w=0.1~0.6, x=0.01~0.2, y=0~0.6, and z=0~0.7.

6. An attenuating phase shift mask blank according to claim 1, wherein the phase shifting layer has a thickness of from about 400 Å to about 2000 Å wherein said surface layer rich in oxygen has a thickness of from about 10 Å to about 150 Å.

7. A method of fabricating an attenuating phase shift mask blank for use in lithography comprising:

providing a substrate;

disposing a thin layer of phase shifting layer on said substrate;

said phase shifting layer comprises a top surface layer;

said top surface layer comprises a higher concentration of oxygen than that part of said phase shifting layer not including said surface layer;

forming a surface layer rich in oxygen on said phase shifting layer;

wherein said blank is capable of producing a photomask with 180° phase shift and an optical transmission of at least 0.001% at a selected wavelenth of <500 nm.

8. A method according to claim 7 wherein the phase shifting layer comprises a composite material of formula $A_wB_xN_yO_z$ where A is an element selected from the group consisting of Groups IVA, VA, or VIA; end B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7.

9. A method according to claim 7 wherein the phase shifting layer comprises a material selected from the group consisting of a silicon/titanium/nitrogen composite and a silicon/titanium/nitrogen/oxygen composite.

10. A method according to claim 9 wherein said silicon/titanium/nitrogen composite has structural formula $Si_wTi_xN_y$ wherein w=0.1~0.6, x=0.01~0.2, y=0.3~0.6, y=0~0.7.

11. A method according to claim 9 wherein said silicon/titanium/nitrogen/oxygen composite has structural formula $Si_wTi_xN_yO_z$ wherein w=0.1~0.6, x=0.01~0.2, y=0~0.6, and z=0~0.7.

12. A method according to claim 7 wherein the phase shifting layer is formed by sputter deposition from a target of a composite material ($Si_{1-x}Ti_x$) wherein x=0.01~0.5 by a method selected from the group consisting of RF matching network, DC magnetron, AC magnetron, pulsed bipolar DC magnetron and RF diode.

13. A method according to claim 12 wherein the substrate is disposed in a holder which can be either planetary or stationary and/or rotating or non-rotating.

14. A method according to claim 8 wherein the phase shifting layer is formed by sputter deposition from a target of a composite material ($Si_{1-x}Ti_x$) wherein x=0.01~0.5 by a method selected from the group consisting of RF matching network, DC magnetron, AC magnetron, pulsed bipolar DC magnetron and RF diode.

15. A method according to claim 14 wherein the substrate is disposed in a holder which can be either planetary or stationary and/or rotating or non-rotating.

16. A method according to claim 9 wherein the phase shifting layer is formed by sputter deposition from a target of a composite material ($Si_{1-x}Ti_x$) wherein x=0.01~0.5 by a method selected from the group consisting of RF matching network, DC magnetron, AC magnetron, pulsed bipolar DC magnetron and RF diode.

17. A method according to claim 16 wherein the substrate is disposed in a holder which can be either planetary or stationary and/or rotating or non-rotating.

18. A method according to claim 7 wherein the phase shifting layer is formed by sputter deposition from two or more targets of different compositions using a technique selected from the group consisting of RF matching network, DC magnetron, AC magnetron, pulsed bipolar DC magnetron and RF diode.

19. A method according to claim 18 wherein said two or more targets are selected from the group consisting of $Si_3N_4$ and Ti targets, or ($Si_{1-x}Ti_x$) wherein x=0.01~0.5 and Ti targets.

20. A method according to claim 18 wherein the substrate is disposed in a holder which can be either planetary or stationary and/or rotating or non-rotating.

21. A method according to claim 8 wherein the phase shifting film is formed by sputter deposition from two or more targets of different compositions using a technique selected from the group consisting of RF matching network, DC magnetron, AC magnetron, pulsed bipolar DC magnetron and RF diode.

22. A method according to claim 21 wherein said two or more targets are selected from the group consisting of $Si_3N_4$ and Ti targets, or ($Si_{1-x}Ti_x$) wherein x=0.01~0.5 and Ti targets.

23. A method according to claim 21 wherein the substrate is disposed in a holder which can be either planetary or stationary and/or rotating or non-rotating.

24. A method according to claim 9 wherein the phase shifting layer is formed by sputter deposition from two or more targets of different compositions using a technique selected from the group consisting of RF matching network, DC magnetron, AC magnetron, pulsed bipolar DC magnetron or RF diode.

25. A method according to claim 24 wherein said two or more targets are selected from the group consisting of $Si_3N_4$ and Ti targets, or ($Si_{1-x}Ti_x$) wherein x=0.01~0.5 and Ti targets.

26. A method according to claim 24 wherein the substrate is disposed in a holder which can be either planetary or stationary and/or rotating or non-rotating.

27. A method according to claim 7 wherein structural changes occur in said phase shifting layer to stabilize against radiation and chemical treatment by including an increased surface oxygen concentration to form said surface layer rich in oxygen which is obtained by annealing at elevated temperature in an atmosphere selected from the group consisting of air, oxygen, vacuum and a mixture of gases selected from the group consisting of $O_2$, $N_2$, $H_2$, Ar, Kr, Ne, He, $O_3$ and $H_2O$.

28. A method according to claim 8 wherein structural changes occur in said phase shifting layer to stabilize against radiation and chemical treatment by including an increased surface oxygen concentration to form said surface layer rich in oxygen which is obtained by annealing at elevated temperature in an atmosphere selected from the group consisting of air, oxygen, vacuum and a mixture of gases selected from the group consisting of $O_2$, $N_2$, $H_2$, Ar, Kr, Ne, He, $O_3$ and $H_2O$.

29. A method according to claim 9 wherein structural changes occur in said phase shifting layer to stabilize against radiation and chemical treatment by including an increased surface oxygen concentration to form said surface layer rich in oxygen which is obtained by annealing at elevated temperature in an atmosphere selected from the group consisting of air, oxygen, vacuum and a mixture of gases selected from the group consisting of $O_2$, $N_2$, $H_2$, Ar, Kr, Ne, He, $O_3$ and $H_2O$.

30. A method according to claim 7 wherein the annealing can be done by using methods selected from the group consisting of laser annealing, plasma annealing, thermal annealing, microwave annealing and radiation treatment.

31. A method according to claim 9 wherein the annealing can be done by using methods selected from the group consisting of laser annealing, plasma annealing, thermal annealing, microwave annealing and radiation treatment.

32. A method according to claim 9 wherein the annealing can be done by using methods selected from the group consisting of laser annealing, plasma annealing, thermal annealing, microwave annealing and radiation treatment.

33. A method of fabricating an attenuating phase shift mask blank for use in lithography comprising:

providing a substrate;

disposing a thin lever of chase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

the surface layer rich in oxygen is obtained by oxygen plasma bombardment.

34. A method of fabricating an attenuating phase shift mask blank for use in lithography comprising:

providing a substrate;

disposing a thin layer of phase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

the phase shifting layer comprises a composite material of formula $A_wB_xN_yO_z$ where A is an element selected from the group consisting of Groups IVA, VA, or VIA; and B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7;

the surface layer rich in oxygen is obtained by oxygen plasma bombardment.

35. A method of fabricating an attenuating phase shift mask blank for use in lithography comprising:

providing a substrate;

disposing a thin layer of phase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

the phase shifting layer comprises a composite material of formula $A_wB_xN_yO_z$ where A is an element selected from the group consisting of Groups IVA, VA, or VIA; and B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7;

the phase shifting layer comprises a material selected from the group consisting of a silicon/titanium/nitrogen composite and a silicon/titanium/nitrogen/oxygen composite;

the surface layer rich in oxygen is obtained by oxygen plasma bombardment.

36. A method of fabricating an attenuating phase shift mask blank for use in lithography comprising:

providing a substrate;

disposing a thin layer of phase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

an oxygen partial pressure of the process gas during deposition is increased at the final stage of deposition.

37. A method of fabricating an attenuating phase shift mask blank for use in lithography comprising:

providing a substrate;

disposing a thin layer of phase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

the phase shifting layer comprises a composite material of formula $A_wB_xN_yO_z$ where A is an element selected from the group consisting of Groups IVA, VA, or VIA; and B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7;

an oxygen partial pressure of the process gas during deposition is increased at the final stage of deposition.

38. A method of fabricating an attenuating phase shift mask blank for use in lithography comprising:

providing a substrate;

disposing a thin layer of phase shifting layer on said substrate;

forming a surface layer rich in oxygen on said phase shifting layer said surface layer comprises a higher concentration of oxygen than that part of said phase shifting layer not including said surface layer;

wherein said blank is capable of producing a photomask with 180° phase shift and an optical transmission of at least 0.001% at a selected wavelenth of <500 nm;

the phase shifting layer comprises a composite material of formula $A_wB_xN_yO_z$ where A is an element selected from the group consisting of Groups IVA, VA, or VIA; and B is selected from the group consisting of an element from Groups II, IV, V, the transition metals, the lanthanides and the actinides; wherein w is in a range between 0.1 and 0.6, x is in a range between 0.01 and 0.2, y is in a range between 0 and 0.6, and z is in a range between 0 and 0.7;

the phase shifting layer comprises a material selected from the group consisting of a silicon/titanium/nitrogen composite and a silicon/titanium/nitrogen/oxygen composite;

an oxygen partial pressure of the process gas during deposition is increased at the final stage of deposition.

39. A method according to claim 7 wherein the sputter target is made by hot isostatic pressing.

40. A method according to claim 8 wherein the sputter target is made by hot isostatic pressing.

41. A method according to claim 9 wherein the sputter target is made by hot isostatic pressing.

42. A method according to claim 7 wherein the sputter target is made of a mixture of metal silicide and silicon.

43. A method according to claim 8 wherein the sputter target is made of a mixture of metal silicide and silicon.

44. A method according to claim 9 wherein the sputter target is made of a mixture of metal silicide and silicon.

45. A method according to claim 7 wherein the sputter target is made of a mixture of titanium silicide and silicon.

46. A method according to claim 8 wherein the sputter target is made of a mixture of titanium silicide and silicon.

47. A method according to claim 9 wherein the sputter target is made of a mixture of titanium silicide and silicon.

* * * * *